(12) United States Patent
Cho et al.

(10) Patent No.: US 10,529,566 B2
(45) Date of Patent: Jan. 7, 2020

(54) DISPLAY PANEL AND MANUFACTURING METHOD OF DISPLAY PANEL

(71) Applicants: HKC Corporation Limited, Shenzhen (CN); Chongqing HKC Optoelectronics Technology Co., ltd., Chongqing (CN)

(72) Inventors: En-Tsung Cho, Chongqing (CN); Yiqun Tian, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/869,176

(22) Filed: Jan. 12, 2018

(65) Prior Publication Data
US 2018/0330947 A1 Nov. 15, 2018

Related U.S. Application Data

(63) Continuation of application No. PCT/CN2017/086154, filed on May 26, 2017.

(30) Foreign Application Priority Data

May 12, 2017 (CN) .......................... 2017 1 0342078

(51) Int. Cl.
*H01L 21/02* (2006.01)
*H01L 27/12* (2006.01)

(52) U.S. Cl.
CPC .. *H01L 21/02595* (2013.01); *H01L 21/02488* (2013.01); *H01L 21/02513* (2013.01);
(Continued)

(58) Field of Classification Search
CPC ......... H01L 21/02595; H01L 21/02488; H01L 21/02513; H01L 21/02532; H01L 27/1274; H01L 21/02354; H01L 21/02675–21/02686; H01L 21/0275; H01L 21/268–2686; H01L 21/428; H01L 23/5254; H01L 23/5258; H01L 39/249; H01L 51/0027; H01L 2021/60112; H01L 2012/60292; H01L 21/7624–76294; H01L 21/762; H01L 21/76202; H01L 21/76224; H01L 21/76254–76256; H01L 21/76259; H01L 21/2007; H01L 21/76262;
(Continued)

(56) References Cited

U.S. PATENT DOCUMENTS

| 2004/0121529 | A1* | 6/2004 | Sohn | H01L 21/2026 438/166 |
| 2004/0132235 | A1* | 7/2004 | Dahmani | H01L 29/78603 438/166 |
| 2005/0156520 | A1* | 7/2005 | Tanaka | H01L 27/3244 313/512 |

* cited by examiner

*Primary Examiner* — Cuong B Nguyen
(74) *Attorney, Agent, or Firm* — WPAT, PC

(57) ABSTRACT

A display panel and a manufacturing method of a display panel are provided. The manufacturing method of a display panel includes: forming the nanoporous silicon oxide material on a substrate to form a nanoporous silicon oxide layer; forming the amorphous silicon material on the nanoporous silicon oxide layer to form an amorphous silicon layer; irradiating the amorphous silicon layer by a laser to crystallize the amorphous silicon layer to form a polycrystalline silicon layer; forming the gate oxide material on the polycrystalline silicon layer to form a gate oxide layer.

6 Claims, 4 Drawing Sheets

(52) U.S. Cl.
CPC .. *H01L 21/02532* (2013.01); *H01L 21/02675* (2013.01); *H01L 27/1274* (2013.01)

(58) Field of Classification Search
CPC ......... H01L 21/76243; H01L 21/76248; H01L 21/76245
See application file for complete search history.

DISPLAY PANEL AND MANUFACTURING METHOD OF DISPLAY PANEL

FIELD OF THE DISCLOSURE

The disclosure relates to the field of display technology, and more particularly to a display panel and a manufacturing method of a display panel.

BACKGROUND

Liquid crystal displays are widely applied due to numerous advantages such as thin bodies, energy saving, radiation-free, etc. Most liquid crystal displays available on the market are backlight-type liquid crystal displays, and such display includes a liquid crystal panel and a backlight module. The working principle of the liquid crystal panel is placing liquid crystal molecules between two parallel glass substrates, and applying a driving voltage on the two glass substrates to control rotation directions of the liquid crystal molecules, for refracting rays from the backlight module to generate images.

A thin film transistor-liquid crystal display (TFT-LCD) gradually occupies the dominant position in the display realm at present because of its properties such as low energy consumption, superior image quality and relatively high production yield, etc. Identically, the TFT-LCD includes a liquid crystal panel and a backlight module. The liquid crystal panel includes a color filter (CF) substrate and a thin film transistor (TFT) substrate. The opposite internal sides of the substrates have transparent electrodes. A layer of liquid crystal (LC) molecules are interposed between the two substrates. The display panel alters the polarization state of light by control of the electric field on the orientation of liquid crystal molecules, and achieves the objective of display by blocking or unblocking the optical path by a polarizer.

In a conventional TFT-LCD manufacturing method, laser with high energy is required to irradiate the amorphous silicon for forming the polycrystalline silicon by crystallizing the amorphous silicon. The energy consumption and the cost are considerable.

SUMMARY

An objective of the disclosure is to provide a manufacturing method of a display panel for reducing the energy of laser irradiation and the cost.

Another objective of the disclosure is to provide a display panel for reducing the energy of laser irradiation and the cost.

Still another objective of the disclosure is to provide a display device for reducing the energy of laser irradiation and the cost.

In order to solve the problem above, an embodiment of the disclosure provides a manufacturing method of a display panel. The manufacturing method includes following steps: forming the nanoporous silicon oxide material on a substrate to form a nanoporous silicon oxide layer; forming the amorphous silicon material on the nanoporous silicon oxide layer to form an amorphous silicon layer; irradiating the amorphous silicon layer by a laser with an energy lower than or equal to 250 megajoules to make the amorphous silicon layer be crystallized into a polycrystalline silicon layer; forming the gate oxide material on the polycrystalline silicon layer to form a gate oxide layer.

Furthermore, the step of forming the amorphous silicon material on the nanoporous silicon oxide layer to form an amorphous silicon layer includes: forming the buffer oxide on the nanoporous silicon oxide layer to form a buffer oxide layer; forming the amorphous silicon material on the buffer oxide layer to form the amorphous silicon layer.

Furthermore, the step of forming the nanoporous silicon oxide material on a substrate to form a nanoporous silicon oxide layer includes: forming the buffer nitride on the substrate to form a buffer nitride layer; forming the nanoporous silicon oxide material on the buffer nitride layer to form the nanoporous silicon oxide layer.

Furthermore, after the step of forming the gate oxide material on the polycrystalline silicon layer to form a gate oxide layer, the manufacturing method further includes forming a gate line on the gate oxide layer.

Equally, in order to solve the problem above, an embodiment of the disclosure further provides a display panel. The display panel includes a nanoporous silicon oxide layer, a polycrystalline silicon layer, and a gate oxide layer.

The nanoporous silicon oxide layer is disposed on the substrate.

The polycrystalline silicon layer is disposed on the nanoporous silicon oxide layer. The polycrystalline silicon layer is formed by irradiating the amorphous silicon layer to be crystallized by a laser with an energy lower than 250 megajoules.

The gate oxide layer is disposed on the polycrystalline silicon layer.

The nanoporous silicon oxide layer is interposed between the polycrystalline silicon layer and the substrate. The polycrystalline silicon layer is interposed between the gate oxide layer and the nanoporous silicon oxide layer.

Furthermore, the display panel further includes a buffer oxide layer. The buffer oxide layer is disposed between the nanoporous silicon oxide layer and the polycrystalline silicon layer.

Furthermore, the display panel further includes a buffer nitride layer. The buffer nitride layer is disposed between the nanoporous silicon oxide layer and the substrate.

Furthermore, the display panel further includes a gate line. The gate line is disposed on the gate oxide layer; the gate oxide layer is interposed between the gate line and the polycrystalline silicon layer.

Furthermore, the substrate includes a glass plate.

Identically, in order to solve the problem above, still another embodiment of the disclosure provides a display device. The display device includes a display panel. The display panel includes a nanoporous silicon oxide layer, a polycrystalline silicon layer disposed on the nanoporous silicon oxide layer, and a gate oxide layer.

The nanoporous silicon oxide layer is disposed on the substrate.

The gate oxide layer is disposed on the polycrystalline silicon layer.

The nanoporous silicon oxide layer is interposed between the polycrystalline silicon layer and the substrate. The polycrystalline silicon layer is interposed between the gate oxide layer and the nanoporous silicon oxide layer.

Furthermore, the display panel further includes a buffer oxide layer. The buffer oxide layer is disposed between the nanoporous silicon oxide layer and the polycrystalline silicon layer.

Furthermore, the display panel further includes a buffer nitride layer. The buffer nitride layer is disposed between the nanoporous silicon oxide layer and the substrate.

Furthermore, the display panel further includes a gate line. The gate line is disposed on the gate oxide layer; the gate oxide layer is interposed between the gate line and the polycrystalline silicon layer.

Furthermore, the substrate includes a glass plate.

In the manufacturing method of the display panel of the disclosure, the disclosure forms the amorphous silicon material on the nanoporous silicon oxide layer to form the amorphous silicon layer. The amorphous silicon layer is crystallized to form the polycrystalline silicon layer by irradiating the amorphous silicon layer with the laser of an energy lower than 250 megajoules. The nanoporous silicon oxide layer of the disclosure has self-assembly mesoporous to make the energy of the laser irradiated on the amorphous silicon layer lower than 250 megajoules. The amorphous silicon layer can be crystallized to form the polycrystalline silicon layer. Therefore, the disclosure reduces the laser irradiation energy and the cost.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the drawings.

DETAILED DESCRIPTION OF PREFERRED EMBODIMENTS

Figure 1:
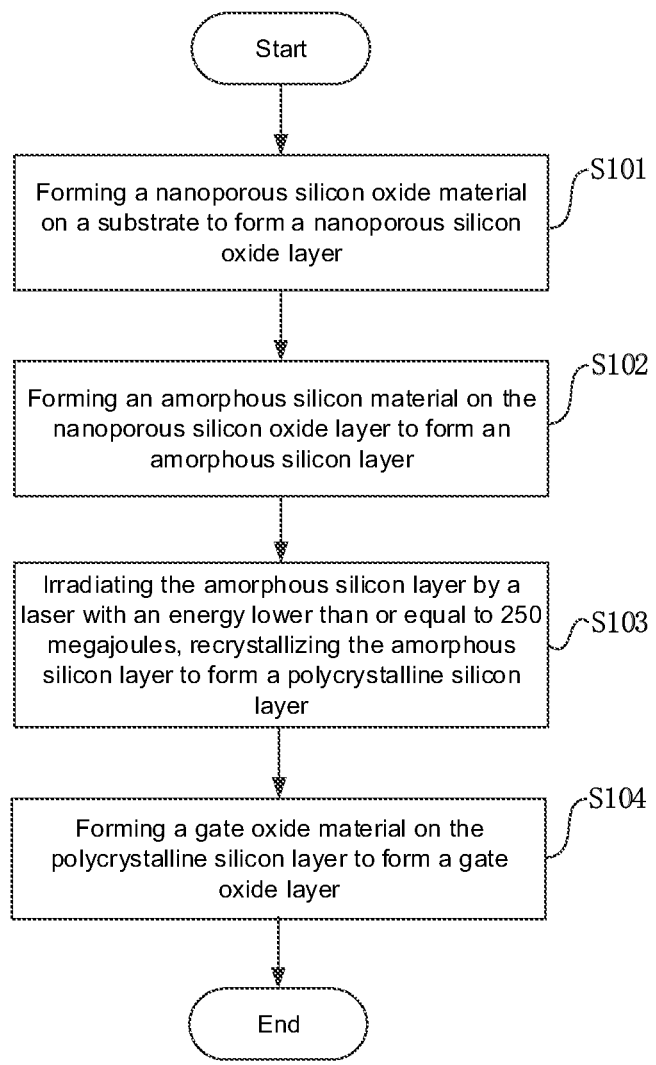
FIG. 1 is a schematic flowchart of a manufacturing method of a display panel according to an embodiment of the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, it should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "contain" and/or "include" define the existence of described features, integers, steps, operations, units and/or components, but do not exclude the existence or addition of one or more other features, integers, steps, operations, units, components and/or combinations thereof.

In the figures, elements with the similar structure are labelled by the same number.

The display panel, the manufacturing method of a display panel and the display device of the disclosure will be further described in detail with reference to FIG. 1 through FIG. 5 and preferred embodiments as follows.

Figure 2:
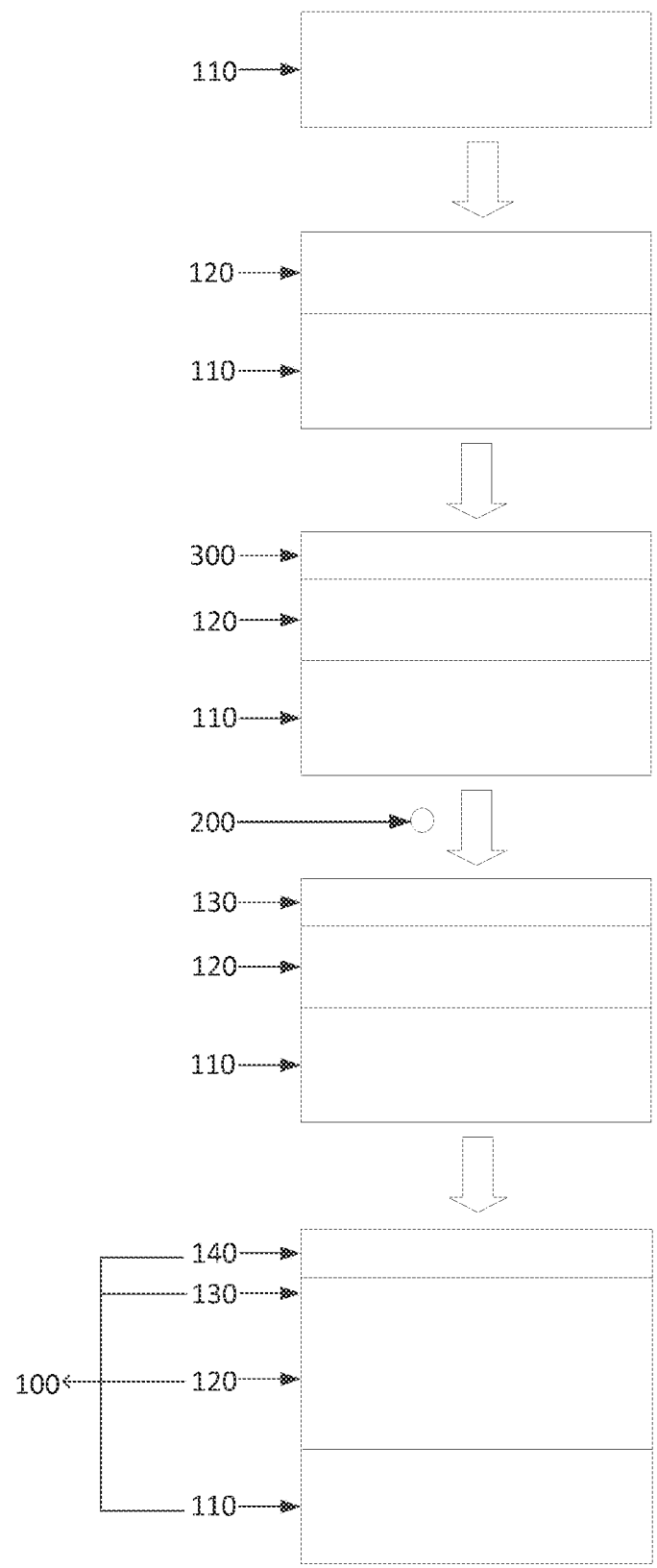
FIG. 2 is a schematic flowchart of a part of a manufacturing method of a display panel according to an embodiment of the disclosure.

According to an embodiment of the disclosure, as shown in FIG. 1 and FIG. 2. FIG. 1 is a schematic flowchart of a manufacturing method of a display panel according to an embodiment of the disclosure. FIG. 2 is a schematic flowchart of a part of a manufacturing method of a display panel according to an embodiment of the disclosure. The embodiment of the disclosure discloses a manufacturing method of a display panel. The manufacturing method of a display panel of the embodiment of the disclosure includes a step S101, a step S102, a step S103 and a step S104 specifically as follows.

The step S101: forming the nanoporous silicon oxide (SiOx) material on a substrate 110 to form a nanoporous silicon oxide layer 120.

The step S102: forming the amorphous silicon (A-Si) material on the nanoporous silicon oxide layer 120 to form an amorphous silicon layer 300.

The step S103: irradiating the amorphous silicon layer 300 by a laser 200 with an energy lower than or equal to 250 megajoules to crystallize the amorphous silicon layer 300 into a polycrystalline silicon layer 130.

The step S104: forming the gate oxide material on the polycrystalline silicon layer 130 to form a gate oxide layer 140.

A part of the display panel 100 can be formed, as shown in FIG. 2.

In the step S101, the substrate 110 can include a glass plate. The glass plate is transparent and convenient for disposition. The substrate 110 of the embodiment should not be limited as such. Other types such as a flexible substrate can be included as well.

The nanoporous silicon oxide layer 120 has self-assembly mesoporous.

In the step S103, the amorphous silicon layer 300 is irradiated by the laser 200 with an energy lower than or equal to 250 megajoules such as 220 megajoules or 235 megajoules to crystallize the amorphous silicon layer 300 to form the polycrystalline silicon layer 130. The energy of laser and the cost are reduced.

Figure 4:
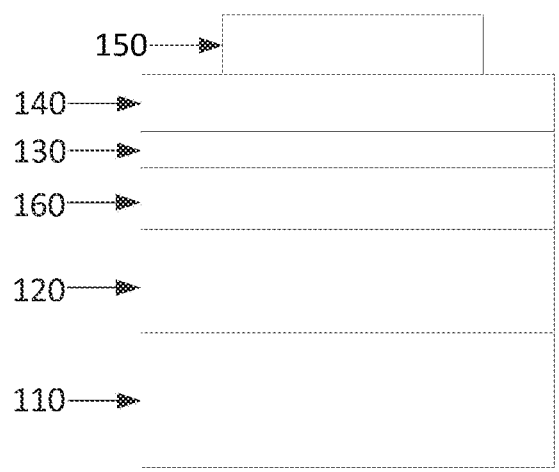
FIG. 4 is a structural schematic view of a display panel according to an embodiment of the disclosure.
Figure 5:
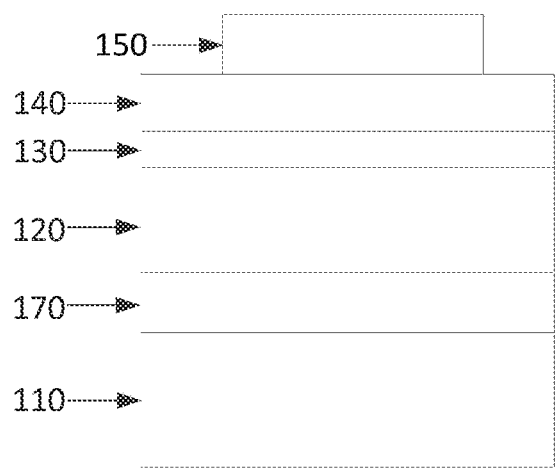
FIG. 5 is a structural schematic view of a display panel according to an embodiment of the disclosure.

According to an embodiment of the disclosure, as shown in FIG. 1, FIG. 2, FIG. 4 and FIG. 5, FIG. 1 is a schematic flowchart of a manufacturing method of a display panel according to an embodiment of the disclosure. FIG. 2 is a schematic flowchart of a part of a manufacturing method of a display panel according to an embodiment of the disclosure. FIG. 4 is a structural schematic view of a display panel according to an embodiment of the disclosure. FIG. 5 is a structural schematic view of a display panel according to an embodiment of the disclosure. The embodiment of the disclosure discloses a manufacturing method of a display panel. The manufacturing method of a display panel of the embodiment of the disclosure includes the step S101, the step S102, the step S103 and the step S104 specifically as follows.

The step S101: forming the nanoporous silicon oxide (SiOx) material on the substrate 110 to form the nanoporous silicon oxide layer 120.

The step S102: forming the amorphous silicon (A-Si) material on the nanoporous silicon oxide layer 120 to form the amorphous silicon layer 300.

The step S103: irradiating the amorphous silicon layer 300 by the laser 200 with an energy lower than 250 megajoules to crystallize the amorphous silicon layer 300 into the polycrystalline silicon layer 130.

The step S104: forming the gate oxide material on the polycrystalline silicon layer 130 to form the gate oxide layer 140.

A part of the display panel 100 can be formed, as shown in FIG. 2.

In the step S101, the substrate 110 can include a glass plate. The glass plate is transparent and convenient for disposition. The substrate 110 of the embodiment should not be limited as such. Other types such as a flexible substrate can be included as well.

The nanoporous silicon oxide layer 120 has self-assembly mesoporous.

Optionally, in the step S101, combined with FIG. 5, the manufacturing method of a display panel can further include steps: forming the buffer nitride on the substrate 110 to form a buffer nitride layer 170; forming the nanoporous silicon oxide material on the buffer nitride layer 170 to form the nanoporous silicon oxide layer 120.

Optionally, in the step S102, combined with FIG. 4, the manufacturing method of a display panel can further include steps: forming the buffer oxide on the nanoporous silicon oxide layer 120 to form a buffer oxide layer 160; forming the amorphous silicon material on the buffer oxide layer 160 to form the amorphous silicon layer 300.

In the step S103, the amorphous silicon layer 300 is irradiated by the laser 200 with an energy lower than 250 megajoules such as 220 megajoules or 235 megajoules to crystallize the amorphous silicon layer 300 into the polycrystalline silicon layer 130. The energy of laser and the cost are reduced.

After the step S104, the manufacturing method of the display panel 100 further includes steps of forming a gate line 150 on the gate oxide layer 140.

In summary, the embodiments of the disclosure pave the amorphous silicon material on the nanoporous silicon oxide layer 120 to form the amorphous silicon layer 300. The amorphous silicon layer 300 is crystallized to form the polycrystalline silicon layer 130 by irradiating the amorphous silicon layer 300 with the laser 200 of an energy lower than 250 megajoules. The nanoporous silicon oxide layer 120 of the embodiments of the disclosure has self-assembly mesoporous to make the energy of the laser 200 irradiated on the amorphous silicon layer 300 lower than 250 megajoules. The amorphous silicon layer 300 can be crystallized to form the polycrystalline silicon layer 130. Therefore, the embodiments of the disclosure reduce the irradiation energy of the laser 200 and the cost.

Figure 3:
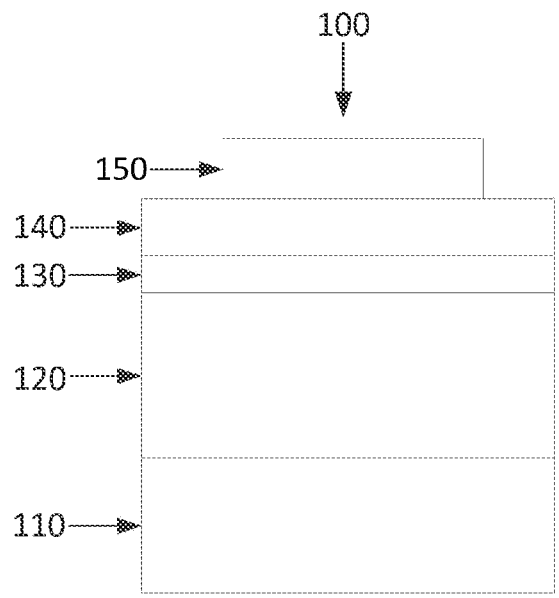
FIG. 3 is a structural schematic view of a display panel according to an embodiment of the disclosure.

The embodiment further discloses a display panel. As shown in FIG. 3 to FIG. 5, FIG. 3 is a structural schematic view of a display panel according to an embodiment of the disclosure. FIG. 4 is a structural schematic view of a display panel according to an embodiment of the disclosure. FIG. 5 is a structural schematic view of a display panel according to an embodiment of the disclosure. Specifically, as shown in FIG. 3, the display panel 100 according to the embodiment of the disclosure includes the substrate 110, the nanoporous silicon oxide layer 120, the polycrystalline silicon layer 130 and the gate oxide layer 140.

FIG. 3 to FIG. 5 of the embodiment of the disclosure merely show a part of the structure of the display panel.

The substrate 110 can include a glass plate. The glass plate is transparent and convenient for disposition. The substrate 110 of the embodiment should not be limited as such. Other types such as a flexible substrate can be included as well.

The nanoporous silicon oxide layer 120 is disposed on the substrate 110; specifically, the nanoporous silicon oxide material is formed on the substrate 110 to form the nanoporous silicon oxide layer 120.

The polycrystalline silicon layer 130 is disposed on the nanoporous silicon oxide layer 120. The polycrystalline silicon layer 130 is formed by irradiating the amorphous silicon layer 300 to be crystallized with the laser 200 of an energy lower than 250 megajoules. Specifically, the amorphous silicon material is formed on the nanoporous silicon oxide layer 120 to form the amorphous silicon layer 300; the amorphous silicon layer 300 is irradiated by the laser 200 with an energy lower than 250 megajoules such as 220 megajoules or 235 megajoules to crystallize the amorphous silicon layer 300 to form the polycrystalline silicon layer 130.

The gate oxide layer 140 is disposed on the polycrystalline silicon layer 130; specifically, the gate oxide material is formed on the polycrystalline silicon layer 130 to form the gate oxide layer 140.

The nanoporous silicon oxide layer 120 is interposed between the polycrystalline silicon layer 130 and the substrate 110. The polycrystalline silicon layer 130 is interposed between the gate oxide layer 140 and the nanoporous silicon oxide layer 120.

The embodiment further discloses a display panel. As shown in FIG. 3 to FIG. 5, FIG. 3 is a structural schematic view of a display panel according to an embodiment of the disclosure. FIG. 4 is a structural schematic view of a display panel according to an embodiment of the disclosure. FIG. 5 is a structural schematic view of a display panel according to an embodiment of the disclosure. Specifically, as shown in FIG. 4 and FIG. 5 combined with FIG. 3, the display panel 100 according to the embodiment of the disclosure includes the substrate 110, the nanoporous silicon oxide layer 120, the polycrystalline silicon layer 130, the gate oxide layer 140 and the gate line 150.

FIG. 3 to FIG. 5 of the embodiment of the disclosure merely show a part of the structure of the display panel The substrate 110 can include a glass plate. The glass plate is transparent and convenient for disposition. The substrate 110 of the embodiment should not be limited as such. Other types such as a flexible substrate can be included as well.

The nanoporous silicon oxide layer 120 is disposed on the substrate 110; specifically, the nanoporous silicon oxide material is formed on the substrate 110 to form the nanoporous silicon oxide layer 120.

The polycrystalline silicon layer 130 is disposed on the nanoporous silicon oxide layer 120. The polycrystalline silicon layer 130 is formed by irradiating the amorphous silicon layer 300 to be crystallized with the laser 200 of an energy lower than 250 megajoules. Specifically, the amorphous silicon material is formed on the nanoporous silicon oxide layer 120 to form the amorphous silicon layer 300; the amorphous silicon layer 300 is irradiated by the laser 200 with an energy lower than 250 megajoules such as 220 megajoules or 235 megajoules to crystallize the amorphous silicon layer 300 to form the polycrystalline silicon layer 130.

The gate oxide layer 140 is disposed on the polycrystalline silicon layer 130; specifically, the gate oxide material is formed on the polycrystalline silicon layer 130 to form the gate oxide layer 140.

The nanoporous silicon oxide layer 120 is interposed between the polycrystalline silicon layer 130 and the substrate 110. The polycrystalline silicon layer 130 is interposed between the gate oxide layer 140 and the nanoporous silicon oxide layer 120.

The gate line 150 is disposed on the gate oxide layer 140; the gate oxide layer 140 is interposed between the gate line 150 and the polycrystalline silicon layer 130.

Furthermore, the display panel 100 further includes the buffer oxide layer 160 or the buffer nitride layer 170.

As shown in FIG. 4, the display panel 100 includes the buffer oxide layer 160. The buffer oxide layer 160 is disposed between the nanoporous silicon oxide layer 120 and the polycrystalline silicon layer 130. Specifically, the buffer oxide is formed on the nanoporous silicon oxide layer 120 to form the buffer oxide layer 160.

As shown in FIG. 5, the display panel 100 includes the buffer nitride layer 170. The buffer oxide layer 170 is disposed between the nanoporous silicon oxide layer 120 and the substrate 110. Specifically, the buffer nitride is formed on the substrate 110 to form the buffer nitride layer 170.

The display panel of the embodiments of the disclosure can be any one below: a twisted nematic (TN) or super twisted nematic (STN) type, an in-plane switching (IPS) type, a vertical alignment (VA) type and a curved panel.

The display panel in the embodiments of the disclosure can be used in a display device. The display device of the embodiments of the disclosure includes the display panel described in detail above. The illustration subject to the structure of the display panel above can be adaptable to the display device of the embodiments of the disclosure as well.

The display device of the embodiments of the disclosure can be a liquid crystal display or an organic light-emitting diode (OLED). When the display device of the embodiment of the disclosure is the liquid crystal display, the liquid crystal display includes a backlight module. The backlight module can be utilized as the light source to supply sufficient brightness and well-distributed light. The backlight module of the embodiment can be a front-light type or a backlight type. The backlight module of the embodiment will not be limited as such.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A manufacturing method of a display panel, comprising following steps:

forming a nanoporous silicon oxide material on a substrate to form a nanoporous silicon oxide layer;

forming an amorphous silicon material on the nanoporous silicon oxide layer to form an amorphous silicon layer, wherein the nanoporous silicon oxide layer comprises self-assembly mesoporous;

irradiating the amorphous silicon layer by a laser with an energy in a range from 235 megajoules to 250 megajoules to make the amorphous silicon layer be crystallized into a polycrystalline silicon layer;

forming a gate oxide material on the polycrystalline silicon layer to form a gate oxide layer;

forming a gate line on the gate oxide layer;

wherein the step of forming a nanoporous silicon oxide material on a substrate to form a nanoporous silicon oxide layer comprises: forming a buffer nitride on the substrate to form a buffer nitride layer, and forming the nanoporous silicon oxide material on the buffer nitride layer to form the nanoporous silicon oxide layer;

wherein the step of forming an amorphous silicon material on the nanoporous silicon oxide layer to form an amorphous silicon layer comprises: forming a buffer oxide on the nanoporous silicon oxide layer to form a buffer oxide layer, and forming the amorphous silicon material on the buffer oxide layer to form the amorphous silicon layer.

2. The manufacturing method of the display panel according to claim 1, wherein the step of forming the nanoporous silicon oxide material on the substrate to form the nanoporous silicon oxide layer comprises:

forming a buffer nitride on the substrate to form a buffer nitride layer;

forming the nanoporous silicon oxide material on the buffer nitride layer to form the nanoporous silicon oxide layer.

3. The manufacturing method of the display panel according to claim 1, wherein the step of forming the amorphous silicon material on the nanoporous silicon oxide layer to form the amorphous silicon layer comprises: forming a buffer oxide on the nanoporous silicon oxide layer to form a buffer oxide layer, and forming the amorphous silicon material on the buffer oxide layer to form the amorphous silicon layer;

wherein the step of forming the nanoporous silicon oxide material on the substrate to form the nanoporous silicon oxide layer comprises: forming a buffer nitride on the substrate to form a buffer nitride layer, and forming the nanoporous silicon oxide material on the buffer nitride layer to form the nanoporous silicon oxide layer.

4. The manufacturing method of the display panel according to claim 1, wherein the step of forming the amorphous silicon material on the nanoporous silicon oxide layer to form the amorphous silicon layer comprises: forming a buffer oxide on the nanoporous silicon oxide layer to form a buffer oxide layer, and forming the amorphous silicon material on the buffer oxide layer to form the amorphous silicon layer.

5. The manufacturing method of the display panel according to claim 2, wherein the step of forming the nanoporous silicon oxide material on the substrate to form the nanoporous silicon oxide layer comprises: forming a buffer nitride on the substrate to form a buffer nitride layer, and forming the nanoporous silicon oxide material on the buffer nitride layer to form the nanoporous silicon oxide layer.

6. The manufacturing method of the display panel according to claim 1, wherein the step of forming the amorphous silicon material on the nanoporous silicon oxide layer to form the amorphous silicon layer comprises: forming a buffer oxide on the nanoporous silicon oxide layer to form a buffer oxide layer, and forming the amorphous silicon material on the buffer oxide layer to form the amorphous silicon layer;

wherein the step of forming the nanoporous silicon oxide material on the substrate to form the nanoporous silicon oxide layer comprises: forming a buffer nitride on the substrate to form a buffer nitride layer, and forming the nanoporous silicon oxide material on the buffer nitride layer to form the nanoporous silicon oxide layer.

\* \* \* \* \*